United States Patent
Hou

(10) Patent No.: US 11,387,298 B2
(45) Date of Patent: Jul. 12, 2022

(54) DISPLAY PANEL, FABRICATION METHOD THEREOF, AND DISPLAY DEVICE

(71) Applicant: BOE TECHNOLOGY GROUP CO., LTD., Beijing (CN)

(72) Inventor: Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 405 days.

(21) Appl. No.: 16/482,466

(22) PCT Filed: Feb. 15, 2019

(86) PCT No.: PCT/CN2019/075235
§ 371 (c)(1),
(2) Date: Jul. 31, 2019

(87) PCT Pub. No.: WO2020/010847
PCT Pub. Date: Jan. 16, 2020

(65) Prior Publication Data
US 2021/0359042 A1    Nov. 18, 2021

(30) Foreign Application Priority Data
Jul. 12, 2018 (CN) .......................... 201810762740.7

(51) Int. Cl.
*H01L 27/32* (2006.01)
(52) U.S. Cl.
CPC ........ *H01L 27/3246* (2013.01); *H01L 27/326* (2013.01); *H01L 2227/323* (2013.01)

(58) Field of Classification Search
CPC ............... H01L 27/3246; H01L 27/326; H01L 2227/323
See application file for complete search history.

(56) References Cited

U.S. PATENT DOCUMENTS

| | | | |
|---|---|---|---|
| 8,835,914 | B2 | 9/2014 | Prushinskiy et al. |
| 9,373,814 | B2 | 6/2016 | Liu et al. |
| 9,653,526 | B2 | 5/2017 | Li |
| 10,461,137 | B2 | 10/2019 | Zhao |

(Continued)

FOREIGN PATENT DOCUMENTS

| | | |
|---|---|---|
| CN | 103413819 A | 11/2013 |
| CN | 103579284 A | 2/2014 |

(Continued)

OTHER PUBLICATIONS

Chinese Office Action in Chinese Application No. 201810762740.7, dated Jun. 10, 2020 with English translation.

(Continued)

*Primary Examiner* — Allan R Wilson
(74) *Attorney, Agent, or Firm* — Collard & Roe, P.C.

(57) ABSTRACT

A display panel, a fabrication method thereof, and a display device are disclosed. The display panel includes: a substrate; a pixel defining layer located on the substrate, the pixel defining layer including: a plurality of openings and a bank enclosing each opening, the bank including a notch; and a first electrode, located at a bottom of each opening and extending into the notch, wherein with respect to a plane where the substrate is located, a height of the first electrode is less than or equal to a maximum height of the notch.

6 Claims, 9 Drawing Sheets

(56) References Cited

U.S. PATENT DOCUMENTS

| | | | |
|---|---|---|---|
| 2006/0159843 A1 | 7/2006 | Sze et al. | |
| 2008/0290790 A1 | 11/2008 | Jin | |
| 2009/0200936 A1* | 8/2009 | Kang | H01L 51/5203 |
| | | | 313/505 |
| 2015/0270319 A1* | 9/2015 | Ishii | H01L 27/3246 |
| | | | 257/40 |
| 2017/0170246 A1* | 6/2017 | Im | H01L 51/5228 |
| 2018/0123076 A1* | 5/2018 | Fukuda | H01L 51/0026 |
| 2018/0151825 A1* | 5/2018 | Choi | H01L 27/3216 |

FOREIGN PATENT DOCUMENTS

| | | |
|---|---|---|
| CN | 104393192 A | 3/2015 |
| CN | 106920828 A | 7/2017 |
| CN | 107452779 A | 12/2017 |
| CN | 107819017 A | 3/2018 |
| CN | 108899349 A | 11/2018 |

OTHER PUBLICATIONS

Chinese Office Action in Chinese Application No. 201810762740.7, dated Mar. 2, 2020 with English translation.
International Search Report of PCT/CN2019/075235 in Chinese, dated Apr. 29, 2019, with English translation.

* cited by examiner

DISPLAY PANEL, FABRICATION METHOD THEREOF, AND DISPLAY DEVICE

CROSS REFERENCE TO RELATED APPLICATIONS

This application is the National Stage of PCT/CN2019/075235 filed on Feb. 15, 2019, which claims priority under 35 U.S.C. § 119 of Chinese Application No. 201810762740.7 filed on Jul. 12, 2018, the disclosure of which is incorporated by reference. The international application under PCT article 21(2) was not published in English.

TECHNICAL FIELD

Embodiments of the present disclosure relate to the field of display technologies, and more particularly, to a display panel, a fabrication method thereof, and a display device.

BACKGROUND

In a conventional organic light-emitting device, a pixel defining layer usually has a substantially trapezoidal shape, whose upper portion is smaller than lower portion in width; however, the structure easily causes ink to climb, that is, a portion of an anode is formed on a side wall and the upper portion of the pixel defining layer, resulting in a short circuit between the anode and a cathode, or causing a risk of electric leakage, so as to affect a display effect of the organic light-emitting device.

SUMMARY

Embodiments of the present disclosure provide a display panel, a fabrication method thereof, and a display device.

In first aspect of the present disclosure, it is provided a display panel, comprising:
 a substrate;
 a pixel defining layer, located on the substrate,
 the pixel defining layer comprising:
 a plurality of openings;
 a bank, enclosing each opening of the plurality of openings and comprising a notch; and
 a first electrode, located at a bottom of each opening and extending into the notch, wherein a height of the first electrode is less than or equal to a maximum height of the notch with respect to a plane where the substrate is located.

In second aspect of the present disclosure, it is provided a display device, comprising the afore-mentioned display panel.

In third aspect of the present disclosure, it is provided a fabrication method of a display panel, comprising:
 providing a substrate;
 forming a pixel defining layer on the substrate, the pixel defining layer comprising a plurality of openings and a bank enclosing each opening, the bank comprising a notch; and
 forming a first electrode at a bottom of each opening of the plurality of openings, the first electrode extending into the notch, wherein a height of the first electrode is less than or equal to a maximum height of the notch with respect to a plane where the substrate is located.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The display panel according to the embodiments of the present disclosure can be applied to an organic light-emitting display device or an inorganic light-emitting display device. For ease of understanding, the present disclosure will be described in detail with the display panel applied to the organic light-emitting display device as an example.

Figure 1:
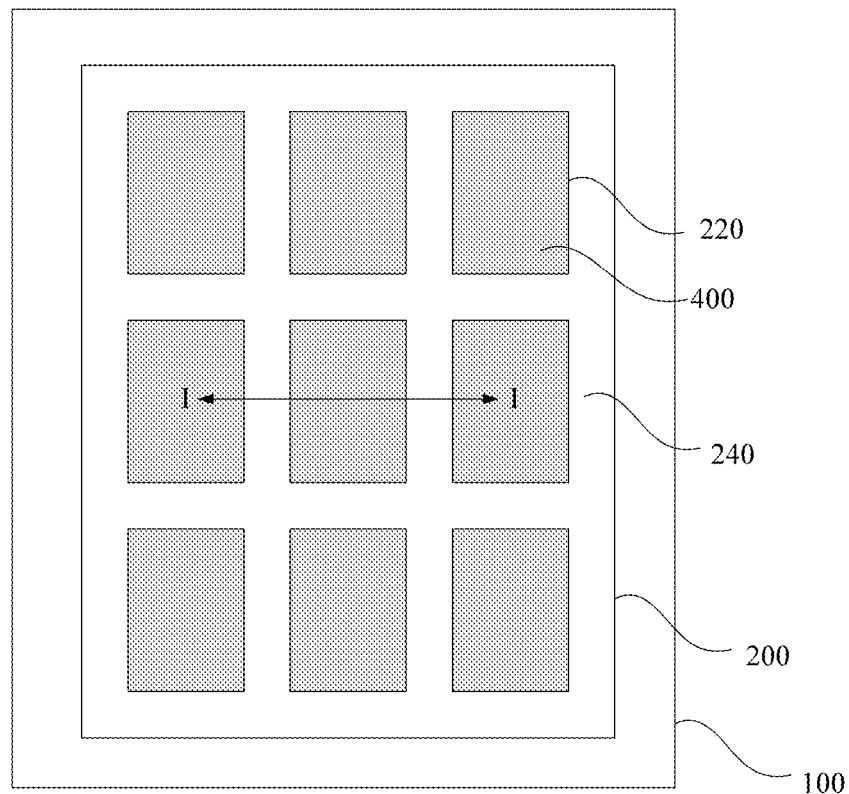
FIG. 1 is a plan view of a display panel according to an embodiment of the present disclosure.
Figure 2:
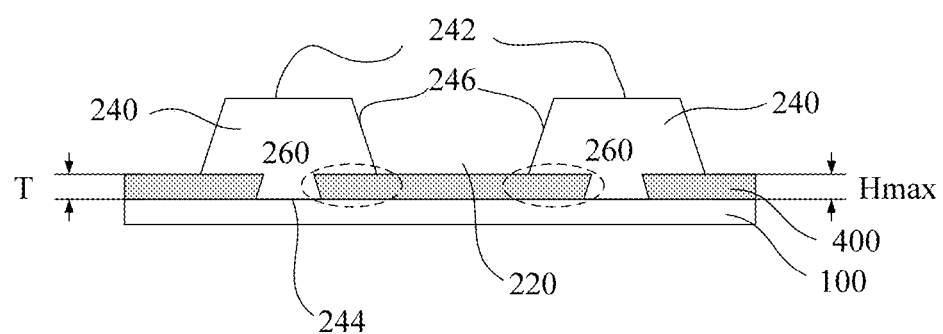
FIG. 2 is a cross-sectional view taken along line I-I of FIG. 1.

An embodiment of the present disclosure provides a display panel. With reference to FIG. 1 to FIG. 2, the display panel comprises: a substrate 100; and a pixel defining layer 200 located on the substrate 100, the pixel defining layer 200 including: a plurality of openings 220 and a bank 240, the bank 240 enclosing each opening of the plurality of openings 220, and the bank 240 including a notch 260; and the display panel further comprises a first electrode 400, located at a bottom of each opening 220 and extending into the notch 260, herein, with respect to a surface of the substrate 100 (i.e., with respect to a plane where the substrate is located), a height T of the first electrode 400 is less than or equal to a maximum height Hmax of the notch 260.

Figure 3:
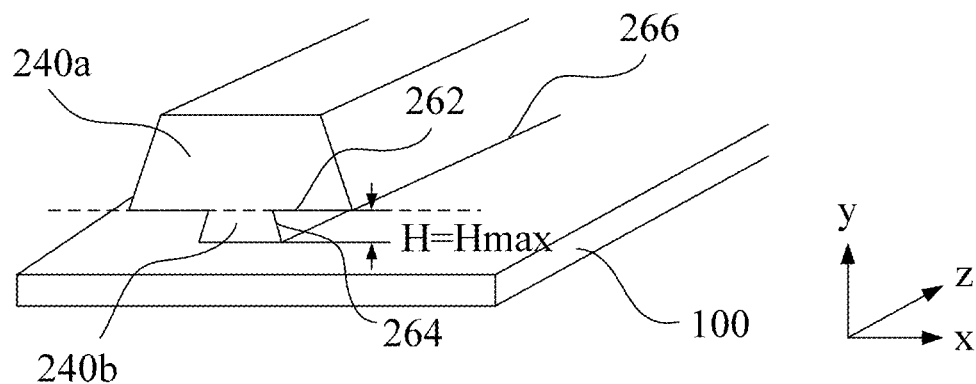
FIG. 3 is a perspective view of a bank according to an embodiment of the present disclosure.

It should be noted that, in all the embodiments of the present disclosure, the "height of the first electrode" and the "height of the notch" are both measured with respect to the surface of the substrate. For example, the "height of the first electrode" refers to a distance from a top face of the first electrode to the surface of the substrate, for example, the height of the first electrode may be understood as a thickness of the first electrode. The "top face of the first electrode" may be understood as an "upper surface of the first electrode"; however, when the upper surface of the first electrode is not located within a same horizontal plane, the "top face of the first electrode" refers to an upper surface farthest away from the substrate. The "height of the notch" refers to a distance from a top wall of the notch to the surface of the substrate. The "top wall of the notch" refers to a wall face of the notch that is farthest away from the substrate. When the distance from the top wall of the notch to the surface of the substrate is a fixed value, a maximum height of the notch is equal to a height of the notch. When the distance from the top wall of the notch to the surface of the substrate is a variable value, the maximum height of the notch is equal to a maximum value of the above-described distance. For example, as illustrated in FIG. 3, in the case that a distance from a top wall 262 of a notch 260 to a surface of a substrate 100 is a fixed value H, then a height of the notch 260 is H, and the height may also be regarded as a maximum height Hmax of the notch, that is, H=Hmax. In all the embodiments of the present application, the notch 260 is not limited to the shape illustrated in FIG. 2 and FIG. 3, because at least one side face provided with the notch may have a non-planar shape, which may be, for example, a sloped surface, a curved surface or a stepped surface, and correspondingly, the distance between the top wall 262 of the notch 260 and the substrate 100 may vary. Therefore, in this case, the "maximum height of the notch" represents a maximum distance between the top wall 262 of the notch 260 and the substrate 100.

In the above-described display panel, the first electrode is, for example, an anode in an organic light-emitting display panel. Because a height of the anode is less than or equal to the maximum height of the notch with respect to the surface of the substrate, that is, the height of the anode is not higher than the maximum height of the notch with respect to the substrate, the anode cannot climb to an upper portion of the bank, which reduces a risk of electric leakage, avoids a short circuit with a second electrode (e.g., a cathode in the organic light-emitting display panel) subsequently formed near the upper portion of the bank, and increases a display effect of the display panel.

In at least some embodiments, a bank includes a top face, a bottom face, and at least one side face connecting the top face and the bottom face; the top face has an area greater than an area of the bottom face; and at least one side face includes a notch. For example, as illustrated in FIG. 1 and FIG. 2, a bank 240 includes a top face 242, a bottom face 244, and at least one side face 246 (for example, four side faces 246 included by the two banks in FIG. 1) connecting the top face 242 and the bottom face 244; an area of the top face 242 is greater than an area of the bottom face 244; and each side face 246 includes a notch 260 (illustrated in a dashed box in FIG. 2). Thus, because the notch is formed on a side surface, the first electrode is further prevented from climbing to an upper portion of the bank.

In at least some embodiments, as illustrated in FIG. 1 to FIG. 3, each opening 220 includes a plurality of side faces, for example, it is formed as enclosed by four side faces 246; a portion of a bank 240 may be removed by a processing method such as cutting, etching, photolithography, and so on, such that one notch 260 is formed on each side face 246, and four notches 260 communicate with one another and surround a first electrode 400. The presence of the notch 260 results in formation of a section (which may also be referred to as a lateral discontinuous section) on a side face circumference of the bank, so that each side face 246 is no longer a continuous and flat surface; because the first electrode 400 accommodated in the notch 260 is located below the section, the first electrode 400 cannot climb toward an upper portion 240a of the bank 240. The "section" may be understood as a plane parallel to a substrate and passing through a position of a top wall of the notch that is farthest away from the substrate; and the section divides the bank into an upper portion and a lower portion. For example, as illustrated in FIG. 3, the section is illustrated by a broken line, and the section divides the bank 240 into the upper portion 240a and a lower portion 240b.

In at least some embodiments, as illustrated in FIG. 2 and FIG. 3, a bank 240 includes an upper portion 240a that is away from a substrate 100 and a lower portion 240b that is close to the substrate. A notch 260 is provided in the lower portion 240b of the bank 200 that is close to the substrate 100, i.e., a side face of the lower portion 240b is concave inwardly, thereby forming a gap between the bank 240 and the substrate 100. The gap forms the notch 260. There is no notch 260 in the upper portion 240a away from the substrate 100. In a plane perpendicular to the substrate 100, a cross-sectional shape of the notch 260 is approximately rectangular. A top wall 262 of the notch 260 and a surface of the substrate 100 are substantially parallel to each other; and a maximum height Hmax of the notch 260 is equal to a vertical distance H from any point on the top wall 262 of the notch 260 to the surface of the substrate 100. The notch 260 is formed in the lower portion 240b of the bank, which reduces a difficulty in fabricating the bank subsequently. For example, in the case that the upper portion 240a and the lower portion 240b are separately fabricated, a shape of the notch may be directly formed while the lower portion 240b is patterned, that is, the notch is formed simultaneously while the lower portion 240b is formed, so as to simplify a fabrication process and reduce fabrication costs.

In at least some embodiments, a notch may be partially or fully filled by a first electrode. For example, as illustrated in FIG. 2, a first electrode 400 fills an entire notch 260. For example, the first electrode 400 is in contact with both a top wall 262 and a side wall 264 of the notch 260, and there is almost no gap in the notch 260. For example, a top face of the first electrode 400 and the top wall 262 of the notch 260 may be considered to be approximately coplanar with each other, thus, with respect to a plane where a substrate 100 is located, a height T of the first electrode 400 is equal to a maximum height Hmax of the notch 260, that is T=Hmax. The first electrode fully fills the notch 260, so that the first electrode can extend into the notch to the greatest extent, which prevents an excess electrode material from climbing toward an upper portion 240a of the bank, and reduces a risk of electric leakage.

Figure 4:
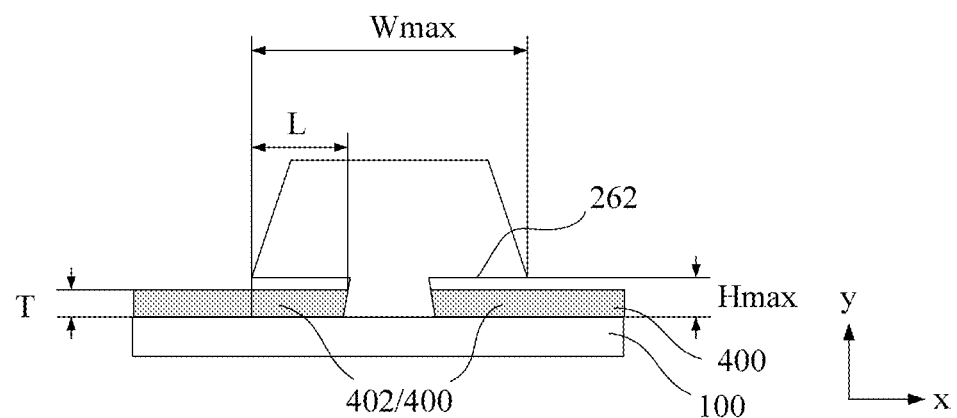
FIG. 4 is a structural schematic diagram of a bank according to an embodiment of the present disclosure.

In at least some embodiments, as illustrated in FIG. 4, a first electrode 400 fills a portion of a notch 260, that is, the first electrode 400 does not fully fill the notch 260. For example, there is still an unfilled gap left between a top face of the first electrode 400 and a top wall 262 of the notch 260. With respect to a plane where a substrate 100 is located, a height T of the first electrode 400 is less than a maximum height Hmax of the notch 260, that is, T<Hmax. Although the first electrode 400 does not fully fill the entire notch 260, the first electrode extends into the notch, which can also avoid climbing toward an upper portion 240a of a bank, and reduces a risk of electric leakage.

In at least some embodiments, a first electrode includes an extension portion that extends into a notch, and a ratio of a length of the extension portion to a maximum width of a bank is greater than or equal to ⅓. For example, as illustrated in FIG. 4, a first electrode 400 includes an extension portion 402 that extends into a notch 260. The extension portion 402 refers to a portion of the first electrode 400 that is located in the notch 260, so a portion of the first electrode that is located outside the notch 260 does not belong to a scope defined by the extension portion 402. As illustrated in FIG. 3, it is assumed that a bank 240 extends along a first direction z, then a length of the extension portion 402 is L within an xy plane perpendicular to the z direction. As illustrated in FIG. 4, a maximum width of the bank refers to a maximum width of an upper portion 240a of the bank. The maximum width of the bank 240 is Wmax, and a ratio of the length L of the extension portion 402 to the maximum width Wmax of the bank 240 is greater than or equal to ⅓. For example, the length L of the extension portion 402 is approximately 10 micrometers. The longer the first electrode 400 extends into the bank 240, the more difficult it is for the first electrode 400 to climb toward the upper portion 240a of the bank 240. Therefore, the above-described ratio is greater than or equal to ¼, preferably greater than or equal to ⅓. Preferably, a ratio of a width of a top face of a lower portion 240b of the bank to a width of a bottom face of the lower portion 240b is less than or equal to ⅓.

In at least some embodiments, at least one side face provided with a notch may have various shape, for example, it may be a non-planar shape. The non-planar shape includes a regular shape and an irregular shape, for example, the non-planar shape includes, but is not limited to, a sloped surface inclined with respect to a plane where the substrate is located, a curved surface or a stepped surface, etc.

Figure 5:
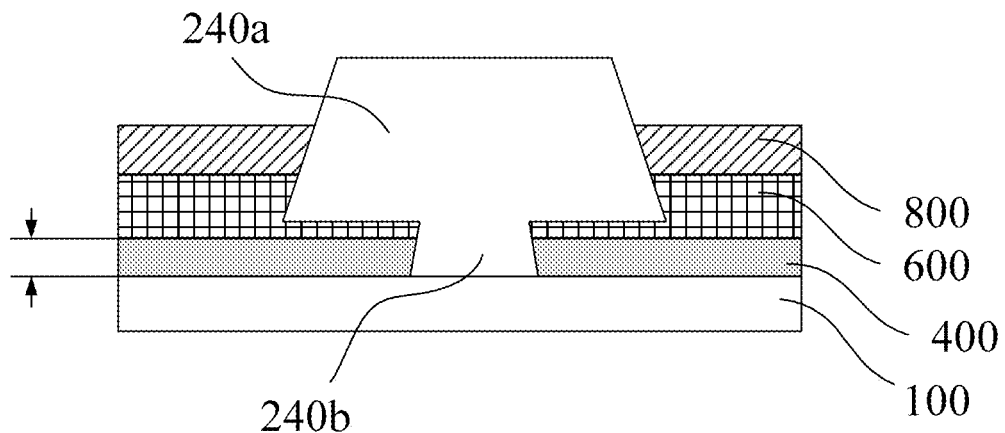
FIG. 5 is a structural schematic diagram of a bank according to another embodiment of the present disclosure.
Figure 6:
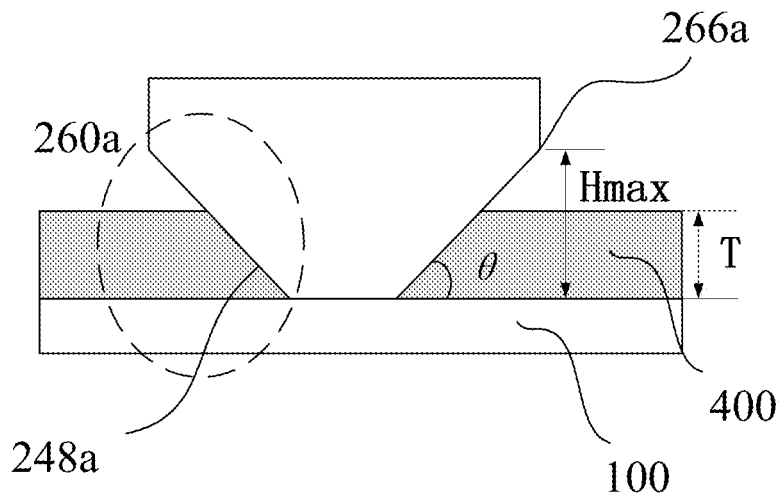
FIG. 6 is a structural schematic diagram of a bank according to yet another embodiment of the present disclosure.

Exemplarily, as illustrated in FIG. 6, a side face of a bank on which a notch 260a is formed is an inclined face 248a with respect to a plane where the substrate is located; an included angle θ between the inclined face 248a and a surface of the substrate is greater than zero degree and less than or equal to 90 degrees, for example, the included angle θ is greater than 30 degrees and less than 60 degrees. Different from FIG. 2 to FIG. 5, in FIG. 6, a distance from a top wall (i.e., the inclined face 248a) of the notch 260 to the surface of the substrate 100 is variable, and the distance gradually increases from inner to outer notch, so a maximum height Hmax of the notch 260 with respect to a plane where the substrate 100 is located is a distance from an outermost top edge 266a of the notch 260a to the substrate 100. A first electrode 400 may partially or fully fill the notch 260a, and accordingly, a height T of the first electrode 400 is equal to or less than the maximum height Hmax of the notch 260a. For example, as illustrated in FIG. 6, the first electrode 400 fills a portion of the notch 260a, so with respect to the plane where the substrate is located, the height T of the first electrode 400 is less than the maximum height Hmax of the notch 260a.

Figure 7:
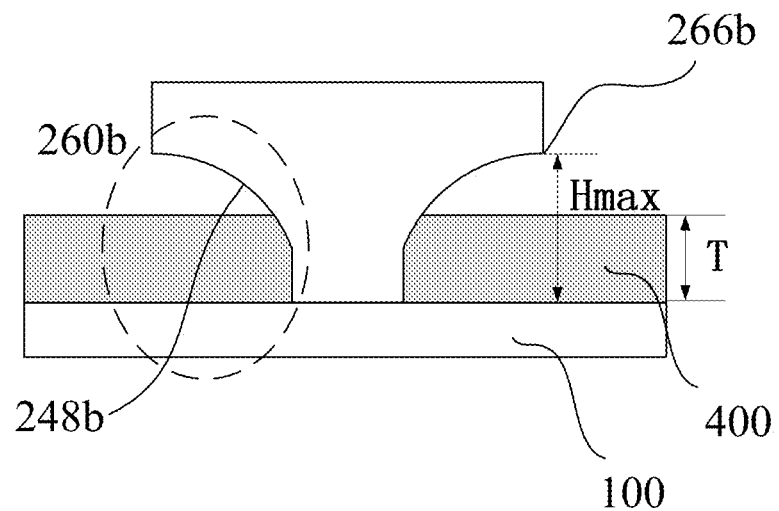
FIG. 7 is a structural schematic diagram of a bank according to still another embodiment of the present disclosure.

Exemplarily, as illustrated in FIG. 7, a side face of a bank on which a notch 260b is formed is a curved surface (or referred to as a concaved surface) 248b; a distance from a top wall (i.e., the curved surface 248b) of the notch 260b to a surface of a substrate 100 is also variable; and at this time, a maximum height Hmax of the notch 260b with respect to a plane where the substrate 100 is located is a distance from an outermost top edge 266b of the notch 260b to the substrate. A first electrode 400 may partially or fully fill the notch 260b; and accordingly, a height T of the first electrode 400 is equal to or less than the maximum height Hmax of the notch 260b. For example, as illustrated in FIG. 7, the first electrode 400 fills a portion of the notch 260b, so with respect to the plane where the substrate is located, the height T of the first electrode 400 is less than the maximum height Hmax of the notch 260b.

Figure 8:
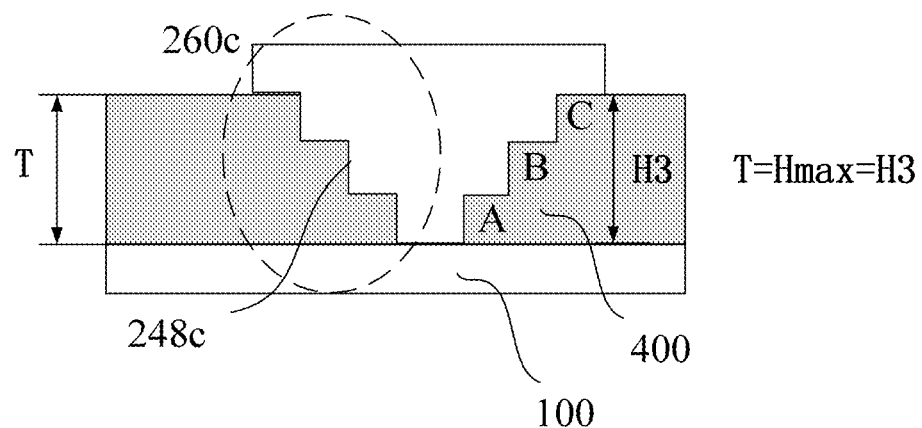
FIG. 8 is a structural schematic diagram of a bank according to another embodiment of the present disclosure.
Figure 9:
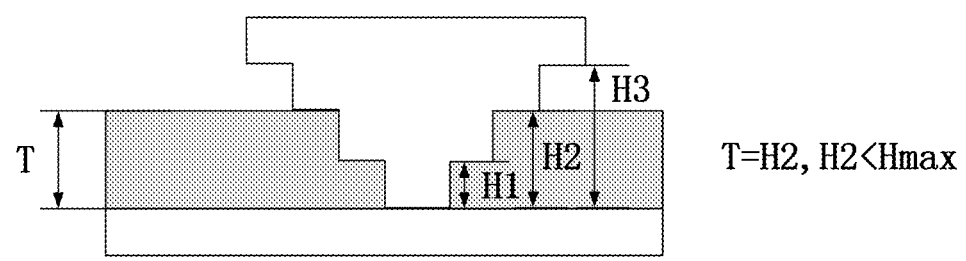
FIG. 9 is a structural schematic diagram of a bank according to yet another embodiment of the present disclosure.
Figure 10:
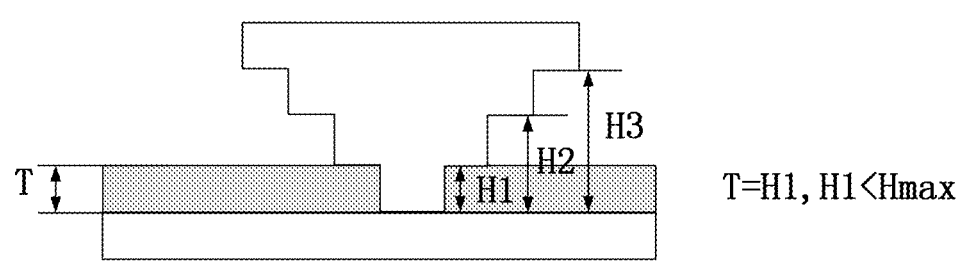
FIG. 10 is a structural schematic diagram of a bank according to still another embodiment of the present disclosure.

Exemplarily, a side face of a bank on which a notch is formed is a stepped surface, and the stepped surface may have one (as illustrated in FIG. 2 to FIG. 5), two or more steps. As illustrated in FIG. 8 to FIG. 10, a side face of a bank on which a notch 260c has three steps A, B and C. Therefore, at the three steps, distances from top walls (i.e., the stepped surface 248c) of the notch 260c to a surface of a substrate 100 are different from one another, respectively, H3>H2>H1, and at this time, a maximum height of the notch 260c with respect to a plane where the substrate 100 is equal to H3, i.e., Hmax=H3. A first electrode 400 may fully or partially fill the notch 260c; and accordingly, a height T of the first electrode 400 is equal to or less than the maximum height Hmax of the notch 260c. As illustrated in FIG. 8, the first electrode 400 fills the entire notch 260c, that is, fills up to a third step C of the notch 260c, so with respect to the plane where the substrate is located, the height T of the first electrode 400 is equal to the maximum height Hmax of the notch 260c, that is, T=Hmax=H3. As illustrated in FIG. 9, the first electrode 400 fills up to a second step B of the notch 260c, so with respect to the plane where the substrate is located, the height T of the first electrode 400 is less than the maximum height Hmax of the notch 260c, that is, T<Hmax and T=H2. As illustrated in FIG. 10, the first electrode 400 fills up to a first step A of the notch 260c, so with respect to the plane where the substrate is located, the height T of the first electrode 400 is less than the maximum height Hmax of the notch 260c, that is, T<Hmax and T=H1.

Figure 11:
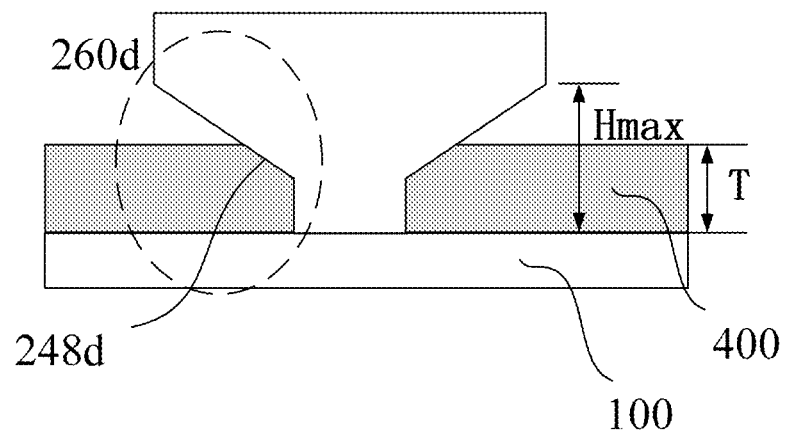
FIG. 11 is a structural schematic diagram of a bank according to another embodiment of the present disclosure.

Exemplarily, as illustrated in FIG. 11, a side face of a bank on which a notch 260d is formed has an irregular shape. A top wall 248d of the notch 260d is a combination of a sloped surface and a vertical surface; a first electrode 400 may fully or partially fill the notch 260d; and accordingly, a height T of the first electrode 400 is equal to or less than a maximum height Hmax of the notch 260d.

Figure 12:
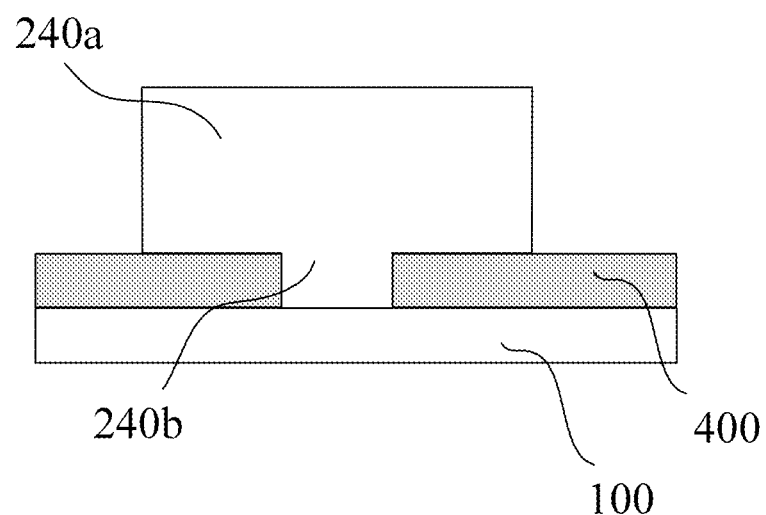
FIG. 12 is a structural schematic diagram of a bank according to yet another embodiment of the present disclosure.
Figure 13:
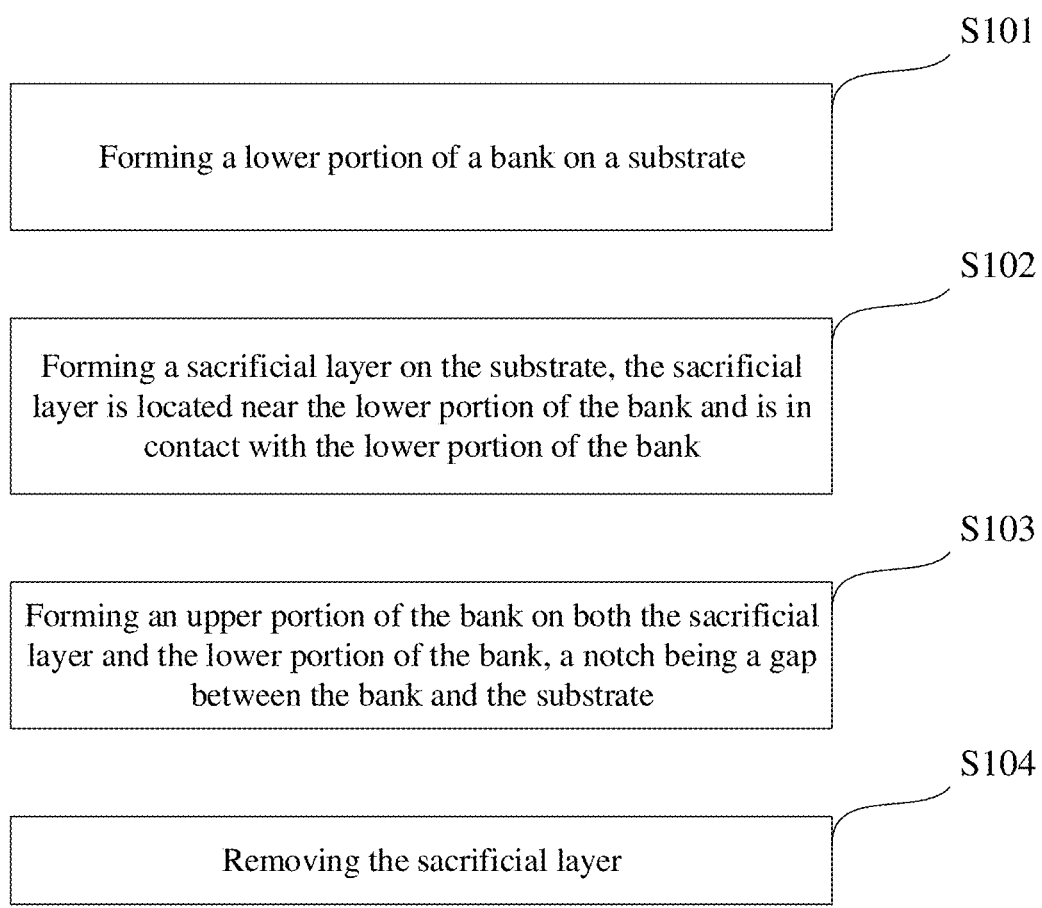
FIG. 13 is a flow chart of fabricating a pixel defining layer in a fabrication method of a display panel according to an embodiment of the present disclosure.

In at least some embodiments, in a plane perpendicular to an extension direction of a bank (e.g., an xy plane), a cross-sectional shape of an upper portion of the bank is a regular trapezoid (i.e., with a short base above and a long base below), an inverted trapezoid (i.e., with a long base above and a short base below), or a rectangle; similarly, a cross-sectional shape of a lower portion of the bank is a regular trapezoid, an inverted trapezoid, or a rectangle. The shapes of the upper portion and the lower portion may be identical to or different from each other. For example, as illustrated in FIG. 2 to FIG. 5, an upper portion 240a and a lower portion 240b of a bank have an identical shape of a regular trapezoid. As illustrated in FIG. 12, an upper portion 240a and a lower portion 240b of a bank have an identical shape of a rectangle. It can be understood that, those skilled in the art may select suitable cross-sectional shapes of the upper portion and the lower portion of the bank according to actual needs.

In at least some embodiments, an upper portion and a lower portion of a bank may be integrally formed, or may also be separately formed. For example, the upper portion and the lower portion of the bank are formed of a same material by using a patterning process, and then a notch is formed by etching or other processes in the lower portion. In at least some embodiments, a bank is usually formed of an organic insulating material (e.g., acrylic resin) or an inorganic insulating material (e.g., silicon nitride SiNx or silicon oxide SiOx). For another example, firstly the lower portion of the bank is formed of one material, and then the upper portion of the bank is formed of another different material. For example, in order to avoid a color mixing problem of pixel regions of different colors, an upper portion 240a of a bank 240 may be formed to be hydrophobic, which is repellent to a solution of an organic electroluminescent material, while a lower portion 240b is formed to be hydrophilic, which is attractive for a solution of an organic electroluminescent material. With a pixel spacer whose upper portion and lower portion are different in wettability, in the case that the organic electroluminescent material falls on the upper portion having a hydrophobic property, due to a repellent action between the two, it is easy for the droplet-shaped organic electroluminescent material to automatically slide back to a pixel region of a corresponding color toward a direction of a substrate, without flowing into an adjacent pixel region of other color. Thus, the color mixing problem of organic light-emitting materials in adjacent pixel regions of different colors is avoided.

Exemplarily, the upper portion 240a of the bank 240 may be formed of a hydrophobic material, while the lower portion 240b thereof may be formed of a hydrophilic material. Exemplarily, a hydrophilic property and a hydrophobic property are defined with respect to the organic electroluminescent material. No matter whether the organic electroluminescent material is a hydrophobic material or a hydrophilic material, the upper portion 240a of the bank 240 is formed of a material whose surface energy is smaller than that of the organic electroluminescent material, while the lower portion 240b of the bank 240 is formed of a material whose surface energy is larger than that of the organic electroluminescent material. For example, in the case that a solvent of ink for forming an organic electroluminescent layer is glycol ether, the material for forming the upper portion 240a of the bank 240 may include polysiloxanes, fluorocarbons, and the like, and the material for forming the lower portion 240b of the bank 240 may include polyamide polymers, epoxy resin, and the like. Exemplarily, the bank 240 may also be made of a dual-functional pixel defining material with upper-lower opposite-property, for example, an Asahi dual-functional pixel defining material. The bank 240 formed of the dual'-functional pixel defining material with upper-lower opposite-property has a hydrophobic upper portion 240a and a hydrophilic lower portion 240b. For example, the bank formed of an Asahi dual-functional pixel defining material has the upper portion made of fluororesin and the lower portion made of polyimide resin. Because fluororesin has small density and is insoluble in a solvent, it gradually rises to a surface of a thin film during a spin coating process and a vacuum drying process. A patterned pixel defining layer is obtained by using a process such as exposure and development, and then the thin film is completely cured by using a post-baking process, to form the bank having the hydrophobic upper portion and the hydrophilic lower portion.

In at least some embodiments, an upper portion 240a and a lower portion 240b of a bank are in contact with each other; and in an interface where they contact each other (i.e., the above-described section), an area of a bottom face of the upper portion 240a is greater than an area of a top face of the lower portion 240b. Further, an orthographic projection of the top face of the lower portion 240b on the substrate 100 is located in an orthographic projection of the bottom face of the upper portion 240a on the substrate 100. However, a size relationship between a top face and the bottom face of the upper portion 240a and a size relationship between the top face and a bottom face of the lower portion 240b will not be limited in the present application. For example, FIG. 12 shows that the area of the top face of the upper portion 240a of the bank is equal to the area of its bottom face, and the area of the top face of the lower portion 240b is equal to the area of its bottom face.

In at least some embodiments, a display panel further comprises an organic functional layer and a second electrode located above the first electrode. Exemplarily, the second electrode is formed over an entire substrate, and overlaying each opening, so the second electrode is located above a maximum height of a notch.

Exemplarily, with further reference to FIG. 5, the display panel further comprises an organic functional layer 600 and a second electrode 800, both of which are located above a first electrode 400; the second electrode 800 and the first electrode 400 are located in a same opening, and the second electrode 800 is located above a maximum height of a notch 260. A portion 240a of a bank 240 that is located above the notch 260 surrounds the second electrode 800. As illustrated in FIG. 5, a portion of the organic functional layer 600 is provided in a gap of the notch 260 not filled by the first electrode 400, and then the second electrode 800 is provided on the organic functional layer 600. Although the first electrode 400 does not fill the entire notch 260, the first electrode 400 still cannot climb to the upper portion 246a of the bank due to presence of the organic functional layer 600, which avoids a short circuit with the second electrode 800 provided near the upper portion 240a of the bank, and increases a display effect of the organic light-emitting display panel. It can be contemplated that, if the unfilled gap is sufficiently large, all the organic functional layers may also be filled in the gap, that is, the notch is fully filled by both the first electrode and the organic functional layer. In at least some embodiments, a first electrode and a second electrode may be made of a same material, and a material suitable for fabricating the electrodes includes, for example, a metal or alloy material, a conductive polymer material, and a transparent conductive material. In the embodiment of the present disclosure, the first electrode and the second electrode are both made of a conductive polymer material such as polythiophene or polyaniline; alternatively, they are both made of metal nanoparticle ink such as nano-Ag ink; alternatively, they are both made of a transparent conductive material such as indium tin oxide (ITO), indium zinc oxide (IZO), or indium gallium zinc oxide (IGZO). In at least some embodiments, an organic functional layer includes a light-emitting layer, an electron injection layer, an electron transport layer, a hole injection layer and a hole transport layer.

An embodiment of the present disclosure further provides a display device, comprising the display panel according to any one of the foregoing embodiments. The display device is, for example, an organic light-emitting display device or an inorganic light-emitting display device.

In the above-described display device, because a height of a first electrode is less than or equal to a maximum height of a notch with respect to a surface of a substrate, the first electrode cannot climb to an upper portion of a bank, which reduces a risk of electric leakage, avoids a short circuit with a second electrode subsequently formed near the upper portion of the bank, and increases a display effect of the display device.

As described above, in at least some embodiments, an organic light-emitting display (OLED) device is provided therein with a first electrode (e.g., an anode), an organic functional layer, and a second electrode (e.g., a cathode); and the anode or the cathode is used for driving an organic light-emitting material to emit light for a display operation.

In at least some embodiments, an inorganic light-emitting display device is a quantum dot light-emitting display (QLED) device, for example, the QLED comprises a first electrode (e.g., an anode), a quantum dot light-emitting layer, and a second electrode (e.g., a cathode); and the anode or the cathode is used for driving the quantum dot light-emitting layer to emit light for a display operation.

Regardless whether in the OLED or the QLED, in at least some embodiments, when an anode is made of a transparent or translucent conductive material, a cathode may be made of reflective metal, then the display device is of a bottom emission type; when the cathode is made of a transparent or translucent conductive material, the anode may be made of reflective metal, then the display device is of a top emission type. When both the anode and the cathode are transparent or translucent, the display device is of a double-sided emission type.

An embodiment of the present disclosure further provides a fabrication method of a display panel, comprising: providing a substrate 100; forming a pixel defining layer 200 on the substrate 100, the pixel defining layer 200 including a plurality of openings 220 and a bank 240 enclosing each opening 220, the bank 240 including a notch 260; the display panel further comprising a first electrode 400 located at a bottom of each opening 220 and extending into the notch 260, herein, with respect to a surface of the substrate 100, a height T of the first electrode 400 is less than or equal to a maximum height Hmax of the notch 260.

In the above-described fabrication method of the display panel, the first electrode is, for example, an anode in the organic light-emitting display panel. Because a height of the anode is less than or equal to the maximum height of the notch with respect to the surface of the substrate, that is, the height of the anode is not higher than the maximum height of the notch with respect to the surface of the substrate, the anode cannot climb to an upper portion of the bank, which reduces a risk of electric leakage, avoids a short circuit with a second electrode (e.g., a cathode in the organic light-emitting display panel) subsequently formed near the upper portion of the bank, and increases a display effect of the display panel.

In the embodiment of the present disclosure, related description in the foregoing embodiments may be referred to for a structure, a material, a shape and a size of the bank in this embodiment, as well as a position, a shape and a size of the notch in this embodiment.

In at least some embodiments, as illustrated in FIG. 13 and FIG. 14(a) to FIG. 14(f), the forming a pixel defining layer 200 on the substrate 100 includes:

S101: forming a lower portion of a bank on a substrate.

Firstly, for example, the lower portion of the bank and photoresist located thereon are formed on the substrate. For example, as illustrated in FIG. 14(a), a first material layer 300 and a photoresist 302 are sequentially formed on a glass substrate 100, the first material layer 300 is made of, for example, an inorganic hydrophilic material; then, the photoresist 302 is exposed and developed with a mask, to form a photoresist reserved region and a photoresist removed region; next, the first material layer 300 corresponding to the photoresist removed region is etched away, so as to form the lower portion 240b of the bank and remaining photoresist 302, as illustrated in FIG. 14(b).

S102: forming a sacrificial layer on the substrate, herein, the sacrificial layer is located near the lower portion of the bank and is in contact with the lower portion of the bank.

For example, as illustrated in FIG. 14(c), a thin film 304 is formed on the substrate on which the bank 240a and the photoresist 302 are formed; then the thin film 304 is etched with a mask 306, herein, the mask 306 includes a light-transmitting region T2 and a light-shielding region T1, the light-shielding region T1 corresponds to a position where the sacrificial layer is to be formed; and a portion of the thin film 304 that corresponds to the light-transmitting region T2 is removed by etching, so as to form a sacrificial layer 500 located near the lower portion 240b of the bank, as illustrated in FIG. 14(d). Exemplarily, a thickness of the sacrificial layer 500 is equal to a thickness of the lower portion 240b of the bank, such that a top face of the sacrificial layer 500 and a top face of the lower portion 240b of the bank are coplanar with each other. For example, the thin film 304 for forming the sacrificial layer 500 may be a metal or alloy material, for example, aluminum or molybdenum.

S103: forming an upper portion of the bank on both the sacrificial layer and the lower portion of the bank, a notch being a gap between the bank and the substrate.

For example, a second material layer and photoresist are sequentially formed on the substrate illustrated in FIG. 14(d); then the photoresist is etched by using a mask to remove a portion of the second material layer that corresponds to the photoresist removed region; and the remaining photoresist is removed, so as to form the upper portion 240a of the bank on both the lower portion 240b and the sacrificial layer 500, as illustrated in FIG. 14(e).

For example, the first material layer of the bank is hydrophilic and the second material layer of the bank is hydrophobic. For example, the first material layer is formed of an inorganic hydrophilic material, which includes, but is not limited to, silicon dioxide, silicon nitride, or silicon oxynitride. For example, the second material layer is formed of an organic hydrophobic layer, which includes, but is not limited to, fluorine-containing poly (methyl methacrylate), fluorine-containing polyimide, and the like. A thickness of the organic hydrophobic layer is typically from 0.5 micrometers to 3 micrometers, preferably, from 0.5 micrometers to 1.5 micrometers; an excessively small thickness results in overflow of ink; and an excessively large thickness results in serious ink climbing, which is not favorable for film formation.

S104: removing the sacrificial layer.

Figure 14:
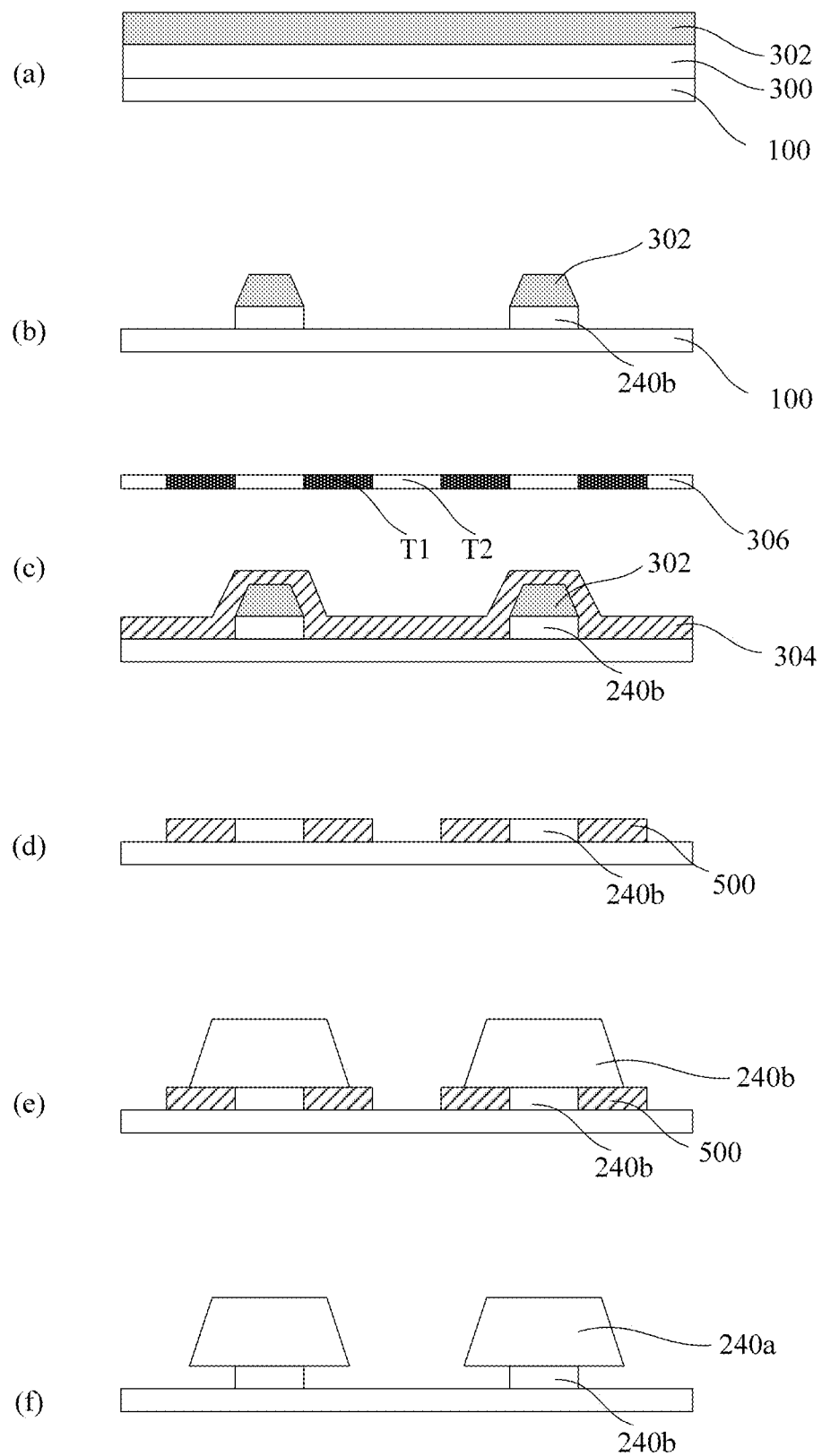
FIG. 14(a) to FIG. 14(f) are structural schematic diagrams of a substrate in respective steps of a fabrication method of a display panel according to an embodiment of the present disclosure.

For example, the sacrificial layer 500 is removed by using a chemical method (for example, a solution corrosion method), to obtain the bank including the upper portion 240*a* and the lower portion 240*b*, so as to form the pixel defining layer, as illustrated in FIG. 14(*f*).

In at least some embodiments, a sacrificial layer may also be formed of a water soluble material, for example, photoresist. In this case, the above-described fabrication method can be simplified.

Figure 15:
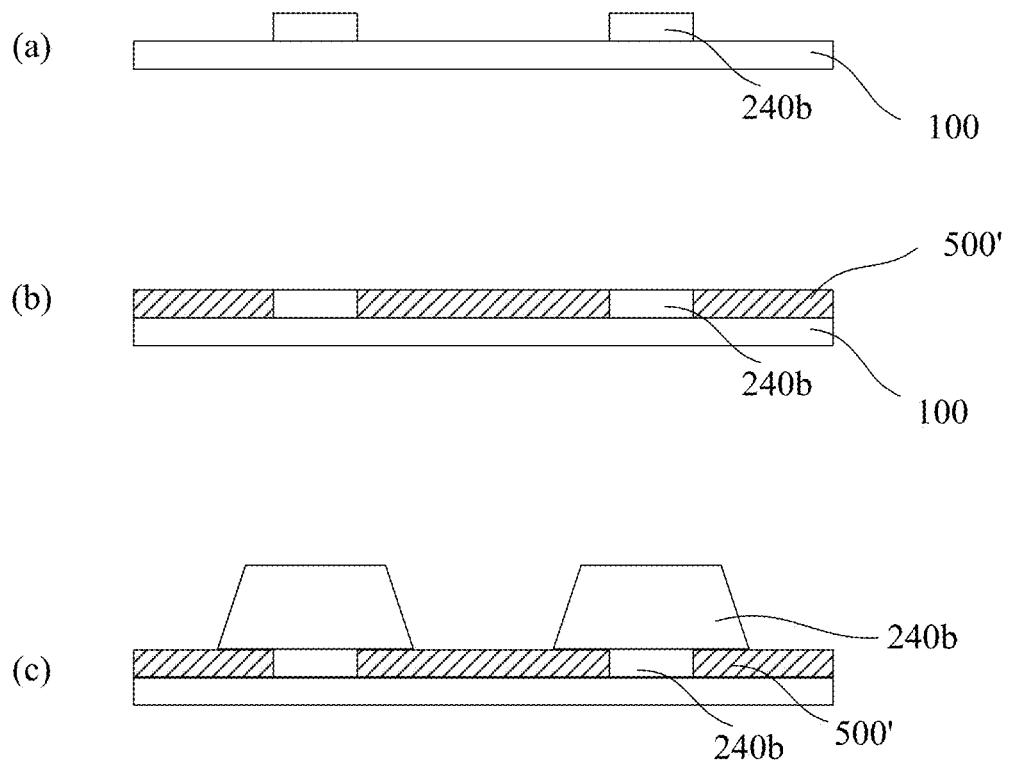
FIG. 15(a) to FIG. 15(c) are structural schematic diagrams of a substrate in respective steps of a fabrication method of a display panel according to another embodiment of the present disclosure.

For example, the fabrication method of the display panel comprises:

S201: removing the remaining photoresist 302 after the substrate is fabricated according to the foregoing process illustrated in FIG. 14(*b*), that is, only reserving the lower portion 240*b* of the bank on the substrate, as illustrated in FIG. 15(*a*);

S202: fabricating a sacrificial layer 500' of a photoresist material on the entire substrate, such that a top face of the sacrificial layer 500' is coplanar with a top face of the lower portion 240*b* of the bank, as illustrated in FIG. 15(*b*);

S203: forming a second material layer on both the sacrificial layer 500' and the lower portion 240*b*, and patterning the second material layer to form an upper portion 240*a* of the bank, as illustrated in FIG. 15(*c*); and S204: removing the sacrificial layer 500' by using a developing process, to finally obtain a substrate the same as that illustrated in FIG. 14(*f*).

In at least some embodiments, a first electrode is formed by using an inkjet printing method. As compared with a conventional solution method and a vacuum evaporation method, the inkjet printing method has advantages of high material utilization rate and low cost; in addition, structural design of a bank according to the embodiment of the present application is favorable for spreading of anode ink, and can reduce a risk of electric leakage. For example, desired ink is inkjet-printed into a pixel region by an inkjet printer; then an organic solvent is removed by vacuum drying, usually with a vacuum degree controlled to be less than 10 Pa; and finally the solvent is removed at a high temperature, for example, a temperature higher than 100° C.

In at least some embodiments, the forming a pixel defining layer 200 on the substrate 100 includes:

S301: forming a dam structure defining a plurality of openings on the substrate.

Figure 16:
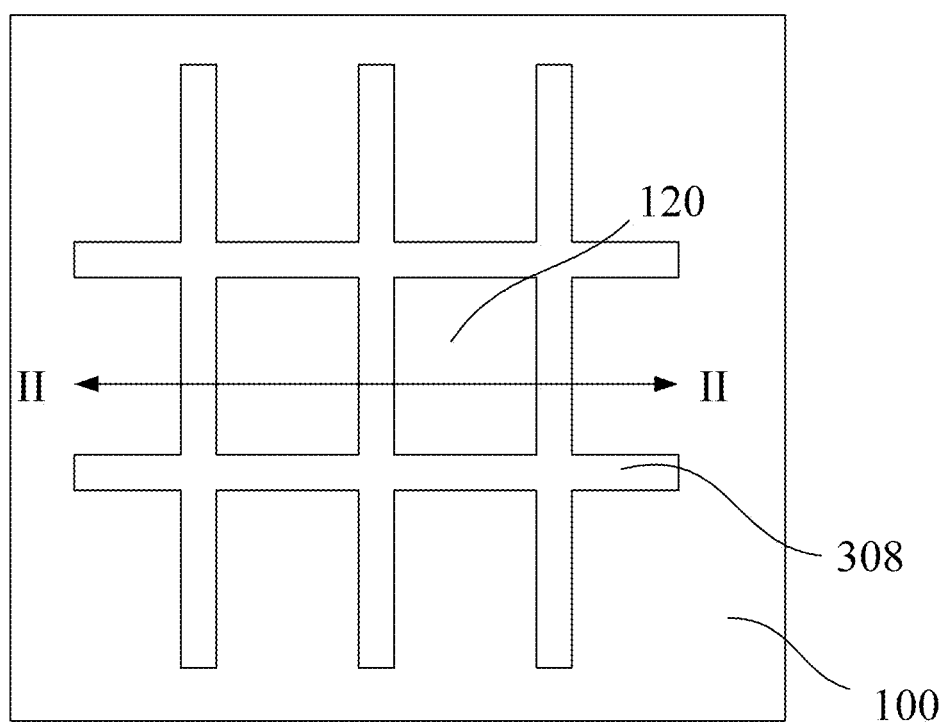
FIG. 16 is a plan view of a display panel according to an embodiment of the present disclosure.
Figure 17:
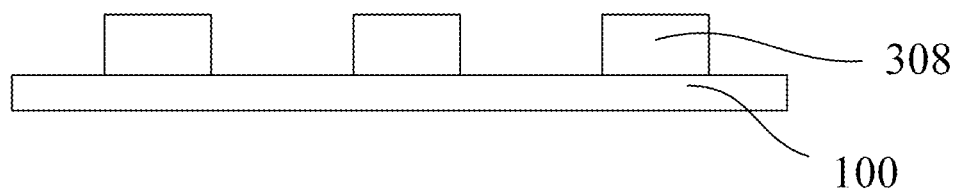
FIG. 17 is a cross-sectional view taken along line II-II of FIG. 16.

For example, a thin film is formed on a substrate 100; the thin film is, for example, made of a material suitable for use as the pixel defining layer; and then a dam structure 308 is formed by using a patterning process, to define a plurality of openings 120, as illustrated in FIG. 16 and FIG. 17.

S302: etching the dam structure, to form a bank including a notch.

Figure 18:
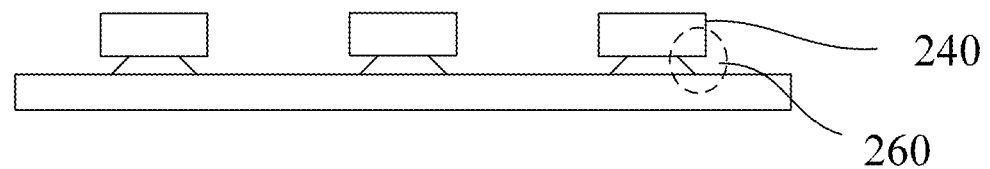
FIG. 18 is a structural schematic diagram of a display panel according to another embodiment of the present disclosure.

For example, a portion of the dam structure that is close to the substrate 100 is etched by using a reactive ion etching method, to form a bank 240 including a notch 260, as illustrated in FIG. 18.

In at least some embodiments, the above-described fabrication method of the display panel further comprises: forming an organic functional layer and a second electrode above a first electrode, the second electrode being located in each opening and located above a maximum height of a notch. As illustrated in FIG. 5, an organic functional layer 600 and a second electrode 800 are formed on a first electrode 400; the second electrode 800 is located in a same opening as the first electrode; and the second electrode 800 is located above a maximum height of a notch 260. A portion 240*a* of the bank 240 that is located above the notch 260 surrounds the second electrode 800.

In the display panel and the fabrication method thereof, and the display device, because the height of the first electrode is less than or equal to the maximum height of the notch with respect to the surface of the substrate, the first electrode cannot climb to the upper portion of the bank, which reduces a risk of electric leakage, avoids a short circuit with the second electrode subsequently formed near the upper portion of the bank, and increases a display effect of the display panel.

In this specification, several points below need to be explained:

(1) The drawings of the embodiments of the present disclosure relate only to the structures involved in the embodiments of the present disclosure, and normal designs may be referred to for other structures.

(2) For the sake of clarity, in the drawings used for describing the embodiments of the present disclosure, thicknesses of layers or regions are enlarged or reduced, that is, these drawings are not drawn in an actual scale.

(3) In case of no conflict, the embodiments of the present disclosure and the features in the embodiments may be combined with each other to obtain a new embodiment.

What is described above is related to the illustrative embodiments of the disclosure only and not limitative to the scope of the disclosure; the scopes of the disclosure are defined by the accompanying claims.

The invention claimed is:

1. A fabrication method of a display panel, comprising:
providing a substrate;
forming a pixel defining layer on the substrate, the pixel defining layer comprising a plurality of openings and a bank enclosing each opening, the bank comprising a notch; and
forming a first electrode at a bottom of each opening of the plurality of openings, the first electrode extending into the notch, wherein a height of the first electrode is less than or equal to a maximum height of the notch with respect to a plane where the substrate is located,
wherein the bank comprises a top face, a bottom face, and at least one side face connecting the top face with the bottom face; the top face has an area greater than an area of the bottom face; and the at least one side face comprises the notch,
wherein the at least one side face comprises a plurality of steps, and a distance from a top wall of the notch to a surface of the substrate is gradually decreased along a direction facing towards the substrate,
wherein the forming the pixel defining layer on the substrate comprises:
forming a first portion of the bank on the substrate, the first portion of the bank being close to the substrate;

forming a sacrificial layer on the substrate, wherein the sacrificial layer is located near the first portion of the bank and is in contact with the first portion;

forming a second portion of the bank on both the sacrificial layer and the first portion of the bank, the second portion of the bank being away from the substrate, the notch being a gap between the bank and the substrate; and removing the sacrificial layer.

2. The fabrication method according to claim 1, wherein the bank comprises a plurality of side faces; each side face comprises the notch; and the notches of the plurality of side faces are connected with one another and surround the first electrode.

3. The fabrication method according to claim 1, wherein a thickness of the sacrificial layer is equal to a thickness of the first portion of the bank, and a top face of the sacrificial layer and a top face of the first portion of the bank are coplanar with each other.

4. The fabrication method according to claim 1, wherein the sacrificial layer is a water soluble material.

5. The fabrication method according to claim 1, wherein the first electrode is formed by using an inkjet printing method.

6. The fabrication method according to claim 1, wherein the forming a pixel defining layer on the substrate comprises:

forming a dam structure on the substrate, the dam structure defining the plurality of openings; and etching the dam structure, to form the bank comprising the notch.

* * * * *